(12) United States Patent
Moczygemba (10) Patent No.: US 10,103,311 B2
(45) Date of Patent: Oct. 16, 2018

(54) FLEXIBLE SINK FOR A THERMOELECTRIC ENERGY GENERATION SYSTEM

(71) Applicant: Marlow Industries, Inc., Dallas, TX (US)

(72) Inventor: Joshua E. Moczygemba, Wylie, TX (US)

(73) Assignee: Marlow Industries, Inc., Dallas, TX (US)

( * ) Notice: Subject to any disclaimer, the term of this patent is extended or adjusted under 35 U.S.C. 154(b) by 47 days.

(21) Appl. No.: 15/211,569

(22) Filed: Jul. 15, 2016

(65) Prior Publication Data

US 2017/0018698 A1  Jan. 19, 2017

Related U.S. Application Data

(60) Provisional application No. 62/194,087, filed on Jul. 17, 2015.

(51) Int. Cl.
| | |
|---|---|
| *H01L 35/08* | (2006.01) |
| *H01L 35/30* | (2006.01) |
| *H01L 35/32* | (2006.01) |
| *H01L 35/34* | (2006.01) |

(52) U.S. Cl.
CPC ............. *H01L 35/32* (2013.01); *H01L 35/08* (2013.01); *H01L 35/30* (2013.01); *H01L 35/34* (2013.01)

(58) Field of Classification Search
CPC ......... H01L 35/08; H01L 35/30; H01L 35/32; H01L 35/34
See application file for complete search history.

(56) References Cited

U.S. PATENT DOCUMENTS

| | | |
|---|---|---|
| 2012/0199336 A1 | 8/2012 | Hsu |
| 2012/0201036 A1 | 8/2012 | Hsu |
| 2012/0227778 A1* | 9/2012 | Leonov ................. H01L 35/30 136/205 |
| 2012/0268936 A1 | 10/2012 | Pickard |
| 2012/0312925 A1 | 12/2012 | Asfia |
| 2012/0327590 A1 | 12/2012 | Heydari |
| 2013/0032322 A1 | 2/2013 | Hsu |
| 2013/0032323 A1 | 2/2013 | Hsu |
| 2013/0126148 A1 | 5/2013 | Koehler |
| 2013/0223012 A1 | 8/2013 | Pierides |
| 2014/0202665 A1 | 7/2014 | Paschkewitz |
| 2014/0204533 A1 | 7/2014 | Abeyasekera |
| 2014/0334106 A1 | 11/2014 | Prest |
| 2014/0352940 A1 | 12/2014 | Whitney |
| 2015/0348867 A1 | 12/2015 | Wang |
| 2016/0003557 A1 | 1/2016 | Harper |

* cited by examiner

*Primary Examiner* — Lindsey Bernier
(74) *Attorney, Agent, or Firm* — Baker Botts L.L.P.

(57) ABSTRACT

A system comprises a plurality of thermoelectric elements, a first plate coupled to the plurality of thermoelectric elements, and a second plate coupled to the plurality of thermoelectric elements. The second plate is arranged to be thermally coupled to an environment. The system further comprises a first plurality of ductile fibers coupled to the second plate. The plurality of ductile fibers are configured to transfer heat between the second plate and the environment.

18 Claims, 7 Drawing Sheets

FLEXIBLE SINK FOR A THERMOELECTRIC ENERGY GENERATION SYSTEM

RELATED APPLICATION

This application claims benefit under 35 U.S.C. § 119(e) of U.S. Provisional Application Ser. No. 62/194,087, titled "A Flexible Sink for A Thermoelectric Energy Generation System," filed Jul. 17, 2015, by Joshua E. Moczygemba.

TECHNICAL FIELD

This disclosure relates generally to energy generation and more particularly to a flexible sink for a thermoelectric energy generation system.

BACKGROUND

The basic theory and operation of thermoelectric devices has been developed for many years. Presently available thermoelectric devices used for cooling typically include an array of thermocouples that operate in accordance with the Peltier effect. Thermoelectric devices may also be used for heating, power generation, and temperature sensing.

SUMMARY

In one embodiment, a system comprises a plurality of thermoelectric elements, a first plate coupled to the plurality of thermoelectric elements, and a second plate coupled to the plurality of thermoelectric elements. The second plate is arranged to be thermally coupled to an environment. The system further comprises a first plurality of ductile fibers coupled to the second plate. The plurality of ductile fibers are configured to transfer heat between the second plate and the environment.

In one embodiment, a method includes thermally coupling a first plate to a plurality of thermoelectric elements and thermally coupling a second plate coupled to the plurality of thermoelectric elements. The method further includes coupling the second plate to an environment. The method also includes coupling a first plurality of ductile fibers to the second plate, where the plurality of ductile fibers configured to transfer heat between the second plate and the environment.

Certain embodiments of the present disclosure may provide one or more technical advantages. In some embodiments, thermoelectric device including a plurality of ductile fibers as a flexible sink may lead to reduced thermal bypass losses and reduced performance degradation. By using ductile fibers in some embodiments, the surface area of flexible sink that is in direct contact with ambient environment surrounding the thermoelectric device may be increased, allowing for more heat to be dissipated and creating for a greater temperature difference between plates.

In some embodiments, the thermoelectric device with a plurality of ductile fibers forming a flexible sink can have reduced mechanical strength requirements by having the flexible sink absorb the energy from external forces and reduce the impact of those external forces on thermoelectric device. The flexible sink may reduce the need for additional mechanical support features such as base plates, bolts, and other rigid structures to protect thermoelectric device from damage or deformation, thus reducing material required and expenses need to create thermoelectric device.

Other technical advantages of the present disclosure will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

Reference is now made to the following description taken in conjunction with the accompanying drawings, wherein like reference numbers represent like parts.

DETAILED DESCRIPTION

Figure 1:
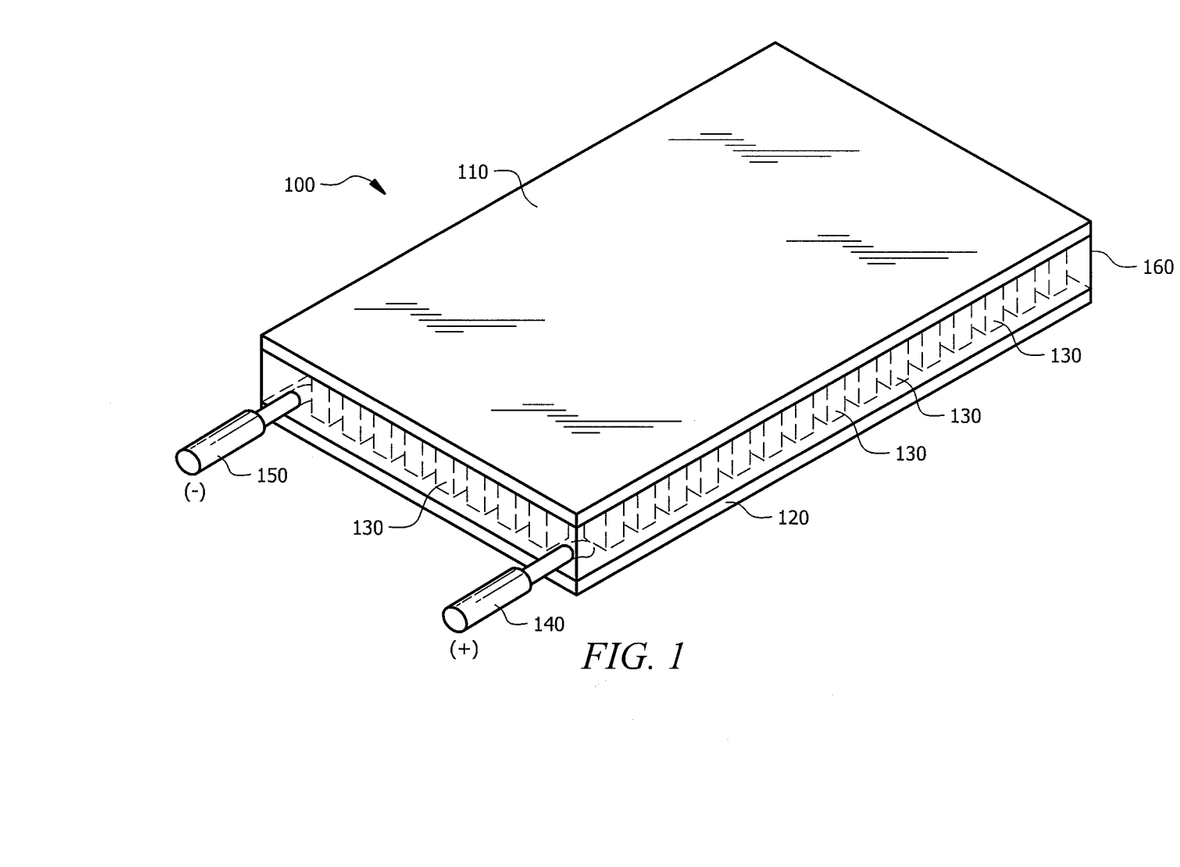
FIG. 1 illustrates one embodiment of a thermoelectric device that is configured to generate electrical energy.

FIG. 1 illustrates one embodiment of thermoelectric device 100. Thermoelectric device 100 includes a plurality of thermoelectric elements 130 disposed between plates 110 and 120. Electrical terminals 140 and 150 are provided to allow thermoelectric device 100 to be electrically coupled to one or more devices that use, transform, or store electrical power. Thermoelectric device 100 may also include wall 160.

In some embodiments, thermoelectric elements 130 are fabricated from dissimilar semiconductor materials such as N-type thermoelectric elements and P-type thermoelectric elements. Thermoelectric elements 130 are typically configured in a generally alternating N-type element to P-type element arrangement and typically include an air gap disposed between adjacent N-type and P-type elements. In many thermoelectric devices, thermoelectric materials with dissimilar characteristics are connected electrically in series and thermally in parallel.

Examples of thermoelectric devices and methods of fabrication are shown in U.S. Pat. No. 5,064,476 titled Thermoelectric Cooler and Fabrication Method; U.S. Pat. No. 5,171,372 titled Thermoelectric Cooler and Fabrication Method; and U.S. Pat. No. 5,576,512 titled Thermoelectric Apparatus for Use with Multiple Power Sources and Method of Operation. These patents are incorporated by reference into the present disclosure.

N-type semiconductor materials generally have more electrons than would be found in the associated ideal crystal lattice structure. P-type semiconductor materials generally have fewer electrons than would be found in the associated ideal crystal lattice structure. The "missing electrons" are sometimes referred to as "holes." The extra electrons and extra holes are sometimes referred to as "carriers." The extra electrons in N-type semiconductor materials and the extra holes in P-type semiconductor materials are the agents or carriers that transport or move heat energy between plates 110 and 120 through thermoelectric elements 130 when subject to a DC voltage potential. These same agents or carriers may generate electrical power when an appropriate temperature difference is present between plates 110 and 120. Terminals 140 and 150 may be coupled to one of plates 110 and 120 with solder or conductive epoxy for operation in lower temperature applications. They may also be connected in a manner that withstands high temperature environments, such as resistance welding, tungsten inert gas (TIG) welding, and laser welding.

In some embodiments, thermoelectric elements 130 may include any thermoelectric material suitable for use in a thermoelectric device. Examples of suitable thermoelectric materials include Clathrates, Bismuth-telluride based material ($Bi_2Te_3$), Lead-telluride based material (PbTe), lead telluride (PbTe), lead germanium telluride (PbGeTe), TAGS alloys (such as $(GeTe)_{0.85}(AgSbTe_2)_{0.15}$), silicon-germanium (SiGe), bismuth antimony (BiSb), and skutterudites.

In some embodiments, alternating thermoelectric elements 130 of N-type and P-type semiconductor materials may have their ends connected by electrical conductors. Conductors may be metallizations formed on thermoelectric elements 130 and/or on the interior surfaces of plates 110 and 120. Conductors may include aluminum, copper, silver, nickel, titanium, and stainless steel, for example. Ceramic materials may be included in plates 110 and 120 which define in part the cold side and hot side, respectively, of thermoelectric device 100. In some embodiments, the ceramic materials may provide electrical isolation from hot and cold side sources. Aluminum metallized ceramics may accommodate thermal stresses (i.e., due to high temperature exposure) of the ceramic/aluminum bond. Examples of suitable ceramic materials include anodized aluminum, aluminum oxide, aluminum nitride, and beryllium oxide.

In some embodiments, thermoelectric elements 130 may be coupled to plates 110 and 120 using a medium. The medium may include brazes and/or solders. For example, aluminum-based brazes and/or solders may be used, such as aluminum-silicon (Al—Si) braze family and/or zinc-aluminum (Zn—Al) solder. Other examples of suitable brazes include magnesium, copper, carbon steel, stainless steel, nickel titanium, and any alloys of these metals. Other examples of suitable solders include tin-lead (SnPb), tin-antimony (SnSb), bismuth-tin (BiSn), tin-indium (SnIn), and lead (Pb). In some embodiments, using such brazes and/or solders may provide for high temperature operation and allow for flexible joints. In some embodiments, thermoelectric device 100 includes wall 160. Wall 160 may immediately surround thermoelectric device 100 and is coupled to plates 110 and 120. In some embodiments, wall 160 may seal the thermoelectric device 100 such that it protects thermoelectric elements 130 from damage due to exposure to an environment (e.g., environment 270 from FIG. 2). For example, wall 160 may prevent moisture from coming into contact with thermoelectric elements 130. In some embodiments, wall 160 may be a low conductivity wall. For example, thermally insulative materials (e.g., room-temperature vulcanized (RTV) silicone, epoxy, polysulfone, Teflon, polycarbonate, nitrile, acrylic) may be used to form wall 160. This may reduce, minimize, or prevent thermal shorting from the hot side to the cold side of thermoelectric device 100 by preventing, in various embodiments, the ingress of water or debris into the interior of the thermoelectric module. This can be used to help force heat through thermoelectric device 100. In some embodiments, wall 160 may enhance the structural support of thermoelectric device 100. For example, wall 160 may be a structural foam.

Figure 2:
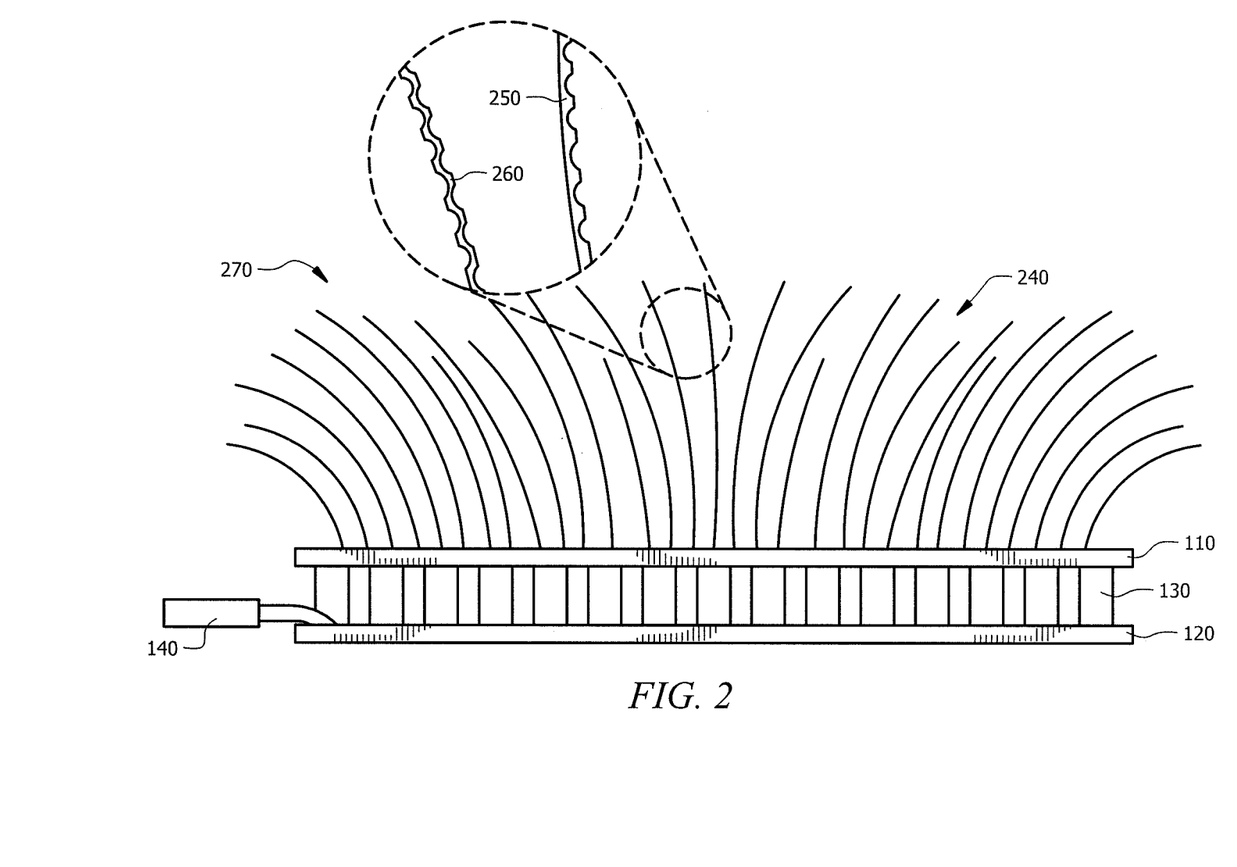
FIG. 2 illustrates an embodiment of a thermoelectric device with a flexible sink.

FIG. 2 is an embodiment of thermoelectric device 100 that includes flexible sink 240. Sink 240 includes a plurality of ductile fibers (e.g., 250, 260). Flexible sink 240 may be a light-weight, non-rigid, passive heat exchanger. Flexible sink 240 may be a hot sink (a sink coupled to the hot side of thermoelectric device 100) or a cold sink (a sink coupled to the cold side of thermoelectric device 100) that dissipates heat into or absorbs heat from a surrounding medium, such as environment 270. Plate 110 or 120 may be thermally coupled to environment 270. In some embodiments, a hot sink collects heat and a cold sink emits heat to environment 270 for power generation. In some embodiments, a cold sink absorbs heat and a hot sink emits heat to environment 270 for cooling applications. Ductile fibers 250 and 260 of flexible sink 240 may be made of wires, metal foam, coils (such as a toroidal coil known as "slinky" coils), or any other structure that allows for flexibility and deformation. Ductile fibers 250 and 260 of flexible sink 240 may be any gauge wire, including, for example, 22-gauge, 24-gauge, 26-gauge, 28-gauge, 30-gauge, 32-gauge, or 34-gauge. The material of the ductile fibers 250 and 260 may be a ductile and strong metal including, for example, platinum, silver, iron, copper, aluminum, gold, or any alloys of these metals created by using brass and/or bronze, and non-metallic materials such as carbon fiber or thermal plastics. In some embodiments, ductile fibers 250 and 260 may be coated or plated to protect them from oxidation, corrosion, or other harmful issues due to exposure to environment 270. For example, ductile fibers 250 and 260 may be coated with nickel or tin. In some embodiments, ductile fibers 250 and 260 of flexible sink 240 may be created by metal plating or metal coating other non-metal materials. For example, ductile fibers 250 and 260 may be metal-coated fiber optic cables or a metal-coated sensor. In some embodiments, flexible sink 240 may be created by attaching (e.g., soldering or epoxying) a multi-strand conductor cable to plate 110 and/or 120. The insulation of the multi-strand conductor cable may be removed and the individual conductor strands may be separated (e.g., fanned out) to form flexible sink 240. Ductile fibers 250 and 260 may be arranged such that they are radiating from plate 110 in a fanned out position to form flexible sink 240.

In some embodiments, ductile fibers 250 and 260 of flexible sink 240 may be coupled directly to one or more plates 110 and/or 120 with solder or epoxy. The solder or epoxy may serve as a matrix material to bind ductile fibers 250 and 260 together as well as to plates 110 and/or 120. Attachment in such manner provides ductility and may aid in improved temperature cycling, such as efficiently cycling through two temperature extremes at a high rate of change. Improved temperature cycling results in less thermal stress imposed on thermoelectric device 100. In some embodiments, an induction soldering technique may be used to couple ductile fibers 250 and 260 of flexible sink 240 to one or more plates 110 and/or 120.

In some embodiments, thermoelectric device 100 including flexible sink 240 may lead to reduced thermal bypass losses and reduced performance degradation. By using ductile fibers 250 and 260, flexible sink 240 provides for a large amount of surface area (e.g., in a range of 6-63 $in^2$) in a small, compact volume (e.g., in a range of 0.0315-0.156 $in^3$). By increasing the surface area that is in direct contact with ambient medium surrounding thermoelectric device 100, flexible sink 240 allows for more heat to be dissipated and to create for a greater temperature difference between plates 110 and 120. This greater temperature difference allows thermoelectric elements 130 to generate more electrical power. In some embodiments, ductile fibers 250 and 260 may be etched to create indentations (e.g., "dimples") on one side (e.g., depicted as ductile fiber 250 of FIG. 2) or both sides (e.g., depicted as ductile fiber 260 of FIG. 2) to further increase the surface area of ductile fibers 250 and 260. This further increase in surface area provides for more heat dissipation, greater temperature difference between plates 110 and 120, and allows thermoelectric elements 130 to generate additional electrical power. In some embodiments, plates 110 and 120 may be smaller than the expanded top portion of flexible sink 240. In some embodiments, the base of flexible sink 240 is much smaller than the expanded top portion of flexible sink 240 such that additional air/fluid flow may contact the entire length of the flexible sink. The splaying of the ductile fibers (e.g., between the base of flexible sink 240 and the open, expanded top portion of flexible sink 240) and their associated small diameter may reduce the sensitivity and performance variants when thermoelectric device 110 is in different orientations (e.g., up, down, sideways given a point of reference). In some embodiments, the base of flexible sink 240 is much smaller (e.g., ratio of about 55:1 or 156:1) than the expanded top portion of flexible sink 240 such that the base restricts less air flow to plate 110 than when the top and bottom portion of a sink are the same size. Further, the thinness of ductile fibers 250 and 260 may allow air or other medium to contact plate 110 rather than impede air flow.

In some embodiments, thermoelectric device 100 with flexible sink 240 can have reduced mechanical strength requirements. For example, thermoelectric device 100 may require mechanical protection against impacts or other external forces to prevent damage or deformation to thermoelectric device 100. Flexible sink 240 may be coupled to thermoelectric device 100 such that it can absorb the energy from external forces and reduce the impact of those external forces on thermoelectric device 100. For example, if a foreign object comes into contact with flexible sink 240, ductile fibers 250 and 260 may absorb the force by bending, deforming, or breaking, while leaving thermoelectric device 100 (and plate 110) untouched, unaffected, or acceptably affected. Flexible sink 240 reduces the need for additional mechanical support features such as base plates, bolts, and other rigid structures to protect thermoelectric device 100 from damage or deformation, thus reducing material required and expenses need to create thermoelectric device 100. By reducing or eliminating additional system components needed for thermoelectric device 100, costs are reduced.

Figure 3:
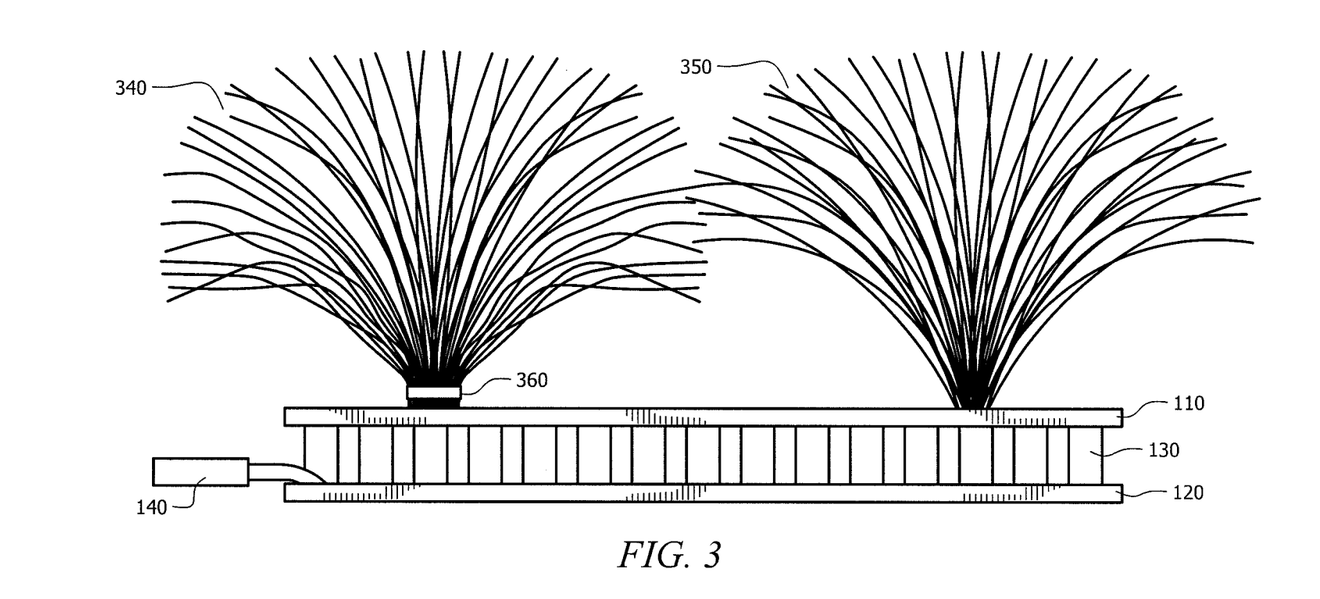
FIG. 3 illustrates an embodiment of a thermoelectric device with one or more flexible sinks.

FIG. 3 is an embodiment of thermoelectric device 100 with one or more flexible sinks 340 and 350. In some embodiments, thermoelectric device 100 may have one or more flexible sinks 340 and 350 or flexible sink sections. For example, if thermoelectric device 100 includes plates 110 and 120 that are large (e.g., greater than or equal to 0.250 in²), it may be practical to include multiple flexible sink sections. This may allow for flexible sinks 340 and 350 to cover the full area of plates 110 and 120, but remain similar in size to sinks used when plates 110 and 120 are not as large in size. Using multiple flexible sinks 340 and 350 may allow for the same configuration, ductile fiber length, or any other component or aspect of sinks 340 and 350 to remain consistent across different sizes of plates 110 and 120. Although FIG. 3 illustrates two flexible sinks 340 and 350, thermoelectric device 100 may include any number of flexible sinks 340 and 350. In some embodiments, thermoelectric device 100 may include flexible sinks 340 and 350 on either or both sides of thermoelectric device 100. For example, thermoelectric device 100 may include flexible sink 340 coupled to plate 110 and an additional flexible sink (e.g., 350) coupled to plate 120.

In some embodiments, flexible sinks 340 and 350 may include ductile fibers 250 and 260 bundled and tightly compact at the base of the bundle where they are connected to plate 110. This bundling of ductile fibers 250 and 260 may create an efficient use of available space on plate 110 and create additional strength that can deflect external forces. In some embodiments, ductile fibers 250 and 260 of flexible sinks 340 and 350 may be bundled or grouped such that they are routed through a compact or tighter area at the base of ductile fibers 250 and 260 (e.g., the end near or attached to plate 110). The other end of ductile fibers 250 and 260 (e.g., farthest away from plate 110) may be in an open, splayed position. The flexibility of ductile fibers 250 and 260 provide opportunities to place thermoelectric device 110 in areas with less open space and more obstructions, but ductile fibers 250 and 260 may still form an open, splayed position such that flexible sinks 340 and 350 provide for heat dissipation sufficient to facilitate a temperature difference between plates 110 and 120.

In some embodiments, flexible sink 340 or 350 may include bind 360. Bind 360 may be an exterior bind or an interior bind. Bind 360 may be arranged near the base of flexible sink 340 and 350 (e.g., where ductile fibers 250 and 260 are coupled to plate 110). Bind 360 allows ductile fibers 250 and 260 to bend (e.g., begin the fanned-out formation) at a location further away from the joint where ductile fibers 250 and 260 are coupled to plate 110. By including bind 360, the stress on the joint may be reduced. For example, an exterior bind 360 may be attached about ⅛ to ¼ of an inch above the joint. Exterior bind 360 may be made of any material with sufficient strength to keep ductile fibers 250 and 260 bound together, such as heat-shrink tubing (e.g., polyolefin, kynar, PVC, acrylated olefin, fluoropolymer) or even one ductile fiber 250 wrapped around the bundle multiple times. The heat-shrink tubing may be about 1/16 to 1/18 inch thick. In some embodiments, an interior bind may also be created by adhering individual ductile fibers (e.g., ductile fibers 250 and 260) together in a section of the ductile fiber bundle. This can be done by back filling a portion of the ductile fiber bundle with solder, braze or epoxy.

In some embodiments, flexible sinks 340 and 350 may have ductile fibers 250 and 260 pre-tempered and bundled, allowing for compact and efficient transportation. For example, a user or customer may receive flexible sinks 340 and 350 where ductile fibers 250 and 260 are bundled together and the user may remove the bundling material to allow the ductile fibers 250 and 260 to transition to an open, splayed, fanned-out position. By bundling flexible sinks 340 and 350, damage during transportation is reduced or eliminated.

Figure 4:
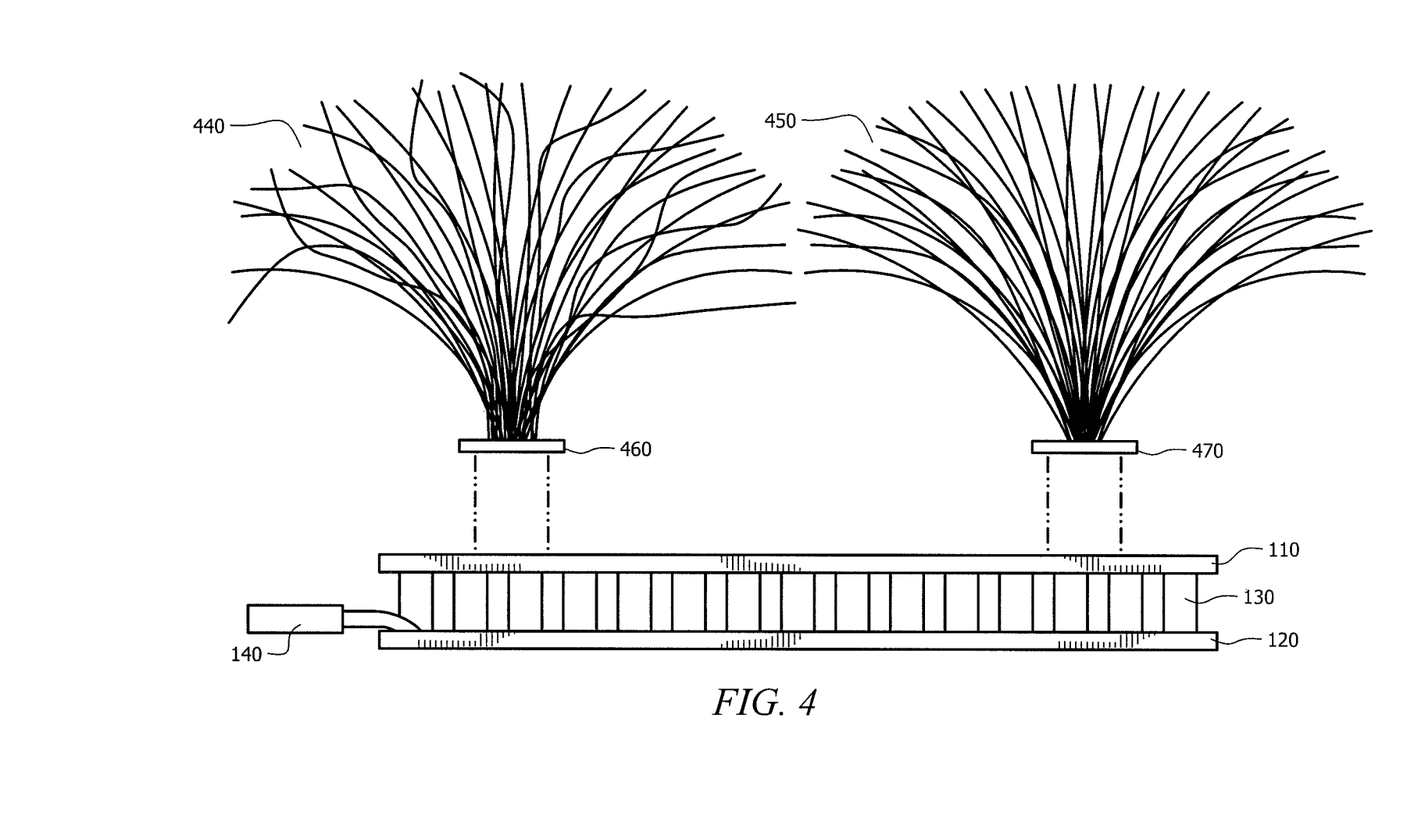
FIG. 4 illustrates an embodiment of a thermoelectric device with a flexible sink mounted on a plate.

FIG. 4 illustrates one embodiment of thermoelectric device 100 with flexible sinks 450 and 440 attached to plates 460 and 470. Plates 460 and 470 may be secondary base plates that provide stability and a uniform structure for manufacturing flexible sinks 440 and 450 and coupling them to plates 110 and/or 120. In some embodiments, plates 460 and 470 may be made from copper, aluminum, brass, or ceramic. In some embodiments, ductile fibers 250 and 260 of flexible sinks 450 and 440 could be brazed, soldered, diffusion bonded, or epoxied. In some embodiments, flexible sinks 450 and 440 are attached to plates 460 and 470 before plates 460 and 470 are attached to plates 110 and 120. This may be advantageous by reducing manufacturing complexity in creating thermoelectric device 100 and allowing the integration of flexible sinks 450 and 440 with thermoelectric device 100 to be simpler.

Figure 5:
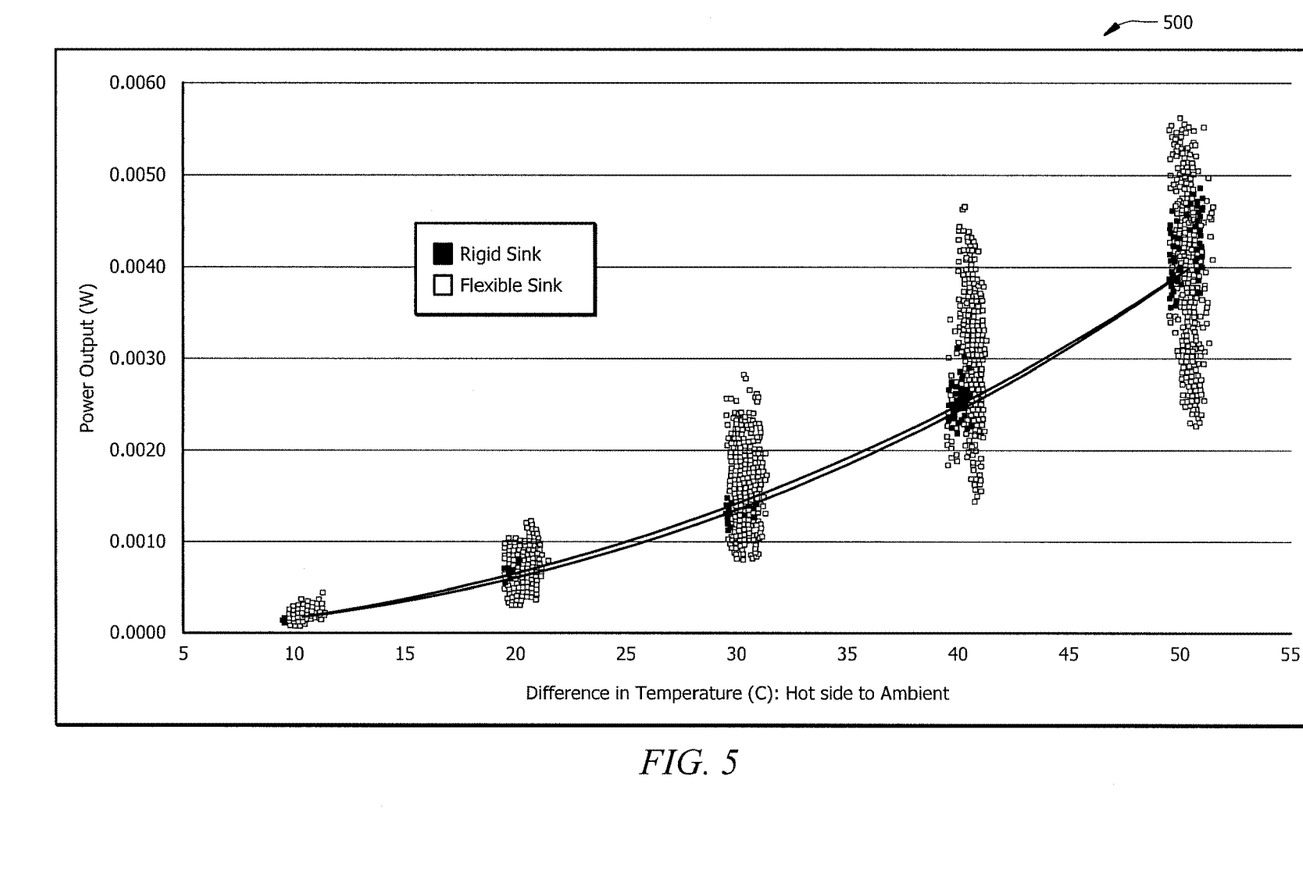
FIGS. 5 through 7 are a set of charts depicting examples of performance characteristics of embodiments of thermoelectric generators with one or more flexible sinks.
Figure 6:
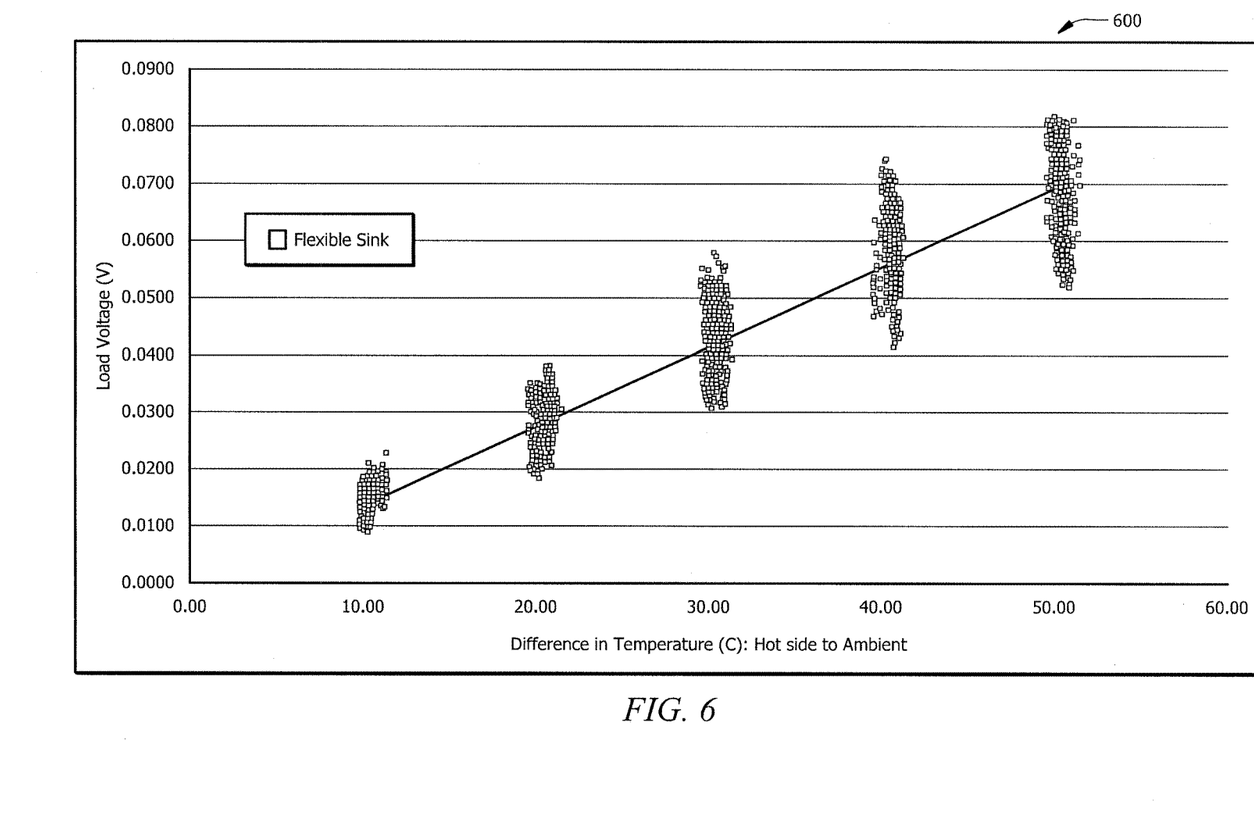
Figure 7:
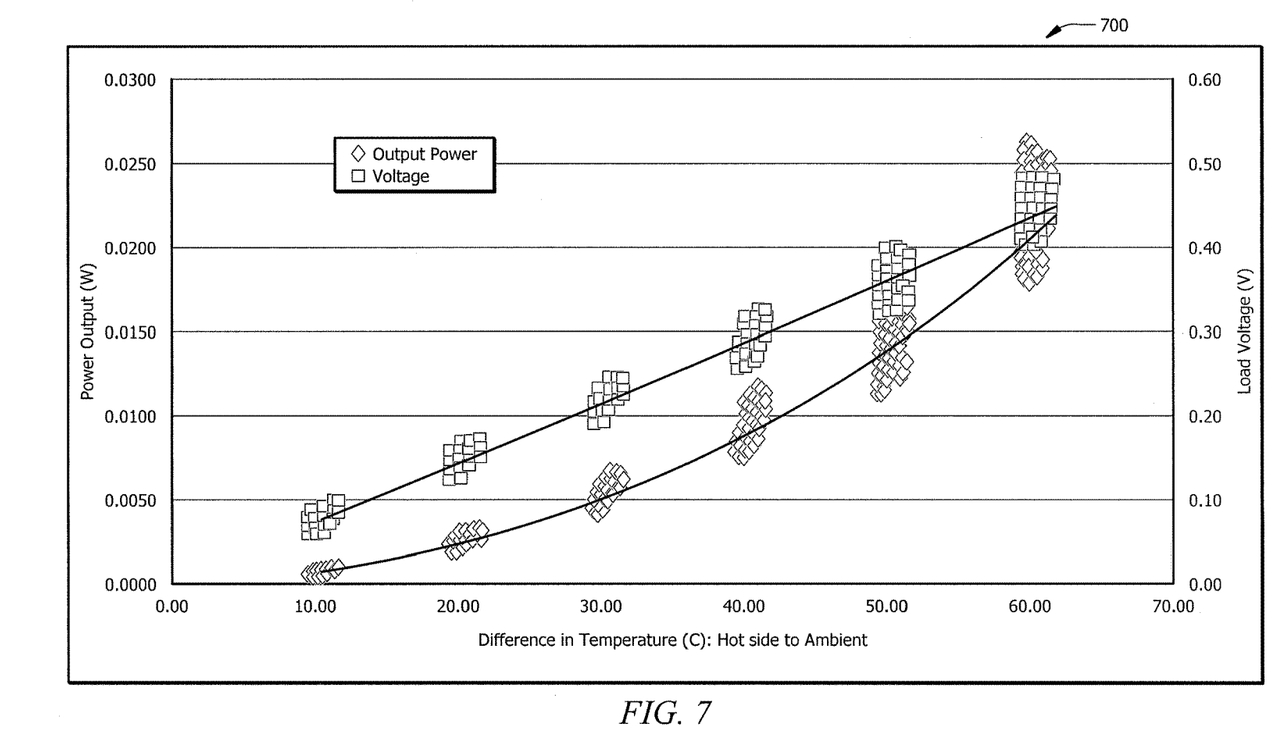

FIGS. 5 through 7 are a set of charts depicting examples of performance characteristics (based on models and experiments) of embodiments of thermoelectric device 100 with one or more flexible sinks 240 of FIG. 2. Chart 500 depicts the power output of two different thermoelectric generators (e.g., such as thermoelectric device 100 of FIG. 1) as a result of the amount of temperature difference present (e.g., the difference in temperature between plate 130 and the ambient environment (e.g., environment 270 from FIG. 2)). The two thermoelectric devices 100, which in some embodiments are identical, may include one in an assembly with a rigid sink (e.g., such as WAKEFIELD pin fin heat sink WF625-45AB) and the other in an assembly with a flexible sink (e.g., flexible sink 240). Chart 500 is the result of experiments where the two thermoelectric devices were tested under similar conditions, such as, with natural convection, no voltage conditioning circuitry, an ambient temperature of about 23 degrees Celsius, and matched load conditions (e.g. 1.2 ohms, 1.6 ohms). Chart 500 illustrates that the thermoelectric device 100 with the rigid sink and the thermoelectric device 100 with a flexible sink (e.g., flexible sink 240), achieve similar performance in power output.

Chart 600 depicts the voltage output of the same thermoelectric generator assembly with the flexible heat sink tested for Chart 500. Chart 600 depicts the typical voltage output under matched load conditions as a result of the amount of temperature difference present (e.g., the difference in temperature between plate 130 and the ambient environment (e.g., environment 270 from FIG. 2)). Data for Chart 600 was generated under the following conditions: natural convection, no voltage conditioning circuitry, and an ambient temperature of about 23 degrees Celsius.

To further illustrate the flexible sink system capability, a second thermoelectric device with a design capable of higher power output was assembled and tested. Chart 700 depicts the power output and output voltage of this thermoelectric generator as a function of the amount of temperature difference present (e.g., the difference in temperature between plate 130 and the ambient environment (e.g., environment 270 from FIG. 2)). Data for Chart 700 was generated under the following conditions: natural convection, matched load conditions, no voltage conditioning circuitry, and an ambient temperature of about 22 degrees Celsius. Chart 700 illustrates that the flexible sink approach may properly function with various different thermoelectric device designs.

Although several embodiments have been illustrated and described in detail, it will be recognized that modifications and substitutions are possible.

What is claimed is:

1. A system comprising:
   a plurality of thermoelectric elements;
   a first plate coupled to the plurality of thermoelectric elements;
   a second plate coupled to the plurality of thermoelectric elements and thermally coupled to an environment;
   a first plurality of ductile fibers configured to transfer heat between the second plate and the environment, the first plurality of ductile fibers having a first end coupled to the environment and a second end coupled to the second plate;
   wherein the first plurality of ductile fibers are bundled together at the second end, and the first plurality of ductile fibers at the first end are arranged such that the first plurality of ductile fibers are radiating from the second plate, and a distance between the first plurality of ductile fibers at the first end is larger than a distance between the first plurality of ductile fibers at the second end.

2. The system of claim 1, wherein the first plurality of ductile fibers are coated with metal.

3. The system of claim 1, wherein the first plurality of ductile fibers are coupled to the second plate using induction soldering.

4. The system of claim 1, wherein the first plurality of ductile fibers are bundled together using a bind.

5. The system of claim 1, wherein the first plurality of ductile fibers are coupled to the second plate using one of solder, braze, and epoxy.

6. The system of claim 1, further comprising a second plurality of ductile fibers coupled to the second plate, the second plurality of ductile fibers configured to transfer heat between the second plate and the environment.

7. The system of claim 1, wherein the first plate is coupled to a second environment, the system further comprising:
   a second plurality of ductile fibers coupled to the first plate, the second plurality of ductile fibers configured to transfer heat between the first plate and the second environment.

8. The system of claim 1, further comprising:
   a third plate, the third plate coupled to the first plurality of ductile fibers and the second plate, the third plate arranged between the second plate and the first plurality of ductile fibers.

9. The system of claim 1, wherein a wall comprising insulative material is situated between the first plate and the second plate, the wall situated around at least one of the plurality of thermoelectric elements.

10. A method comprising:
    thermally coupling a first plate to a plurality of thermoelectric elements;
    thermally coupling a second plate to the plurality of thermoelectric elements and to an environment; and
    coupling a first plurality of ductile fibers to the second plate, the first plurality of ductile fibers configured to transfer heat between the second plate and the environment,
    the first plurality of ductile fibers having a first end coupled to the environment and a second end coupled to the second plate;
    wherein the first plurality of ductile fibers are bundled together at the second end, and the first plurality of ductile fibers at the first end are arranged such that the first plurality of ductile fibers are radiating from the second plate, and a distance between the first plurality of ductile fibers at the first end is larger than a distance between the first plurality of ductile fibers at the second end.

11. The method of claim 10, wherein the first plurality of ductile fibers are coated with metal.

12. The method of claim 10, wherein the first plurality of ductile fibers are coupled to the second plate using induction soldering.

13. The method of claim 10, wherein the first plurality of ductile fibers are bundled together using a bind.

14. The method of claim 10, wherein the first plurality of ductile fibers are coupled to the second plate using one of solder, braze, and epoxy.

15. The method of claim 10, further comprising coupling a second plurality of ductile fibers to the second plate, the second plurality of ductile fibers configured to transfer heat between the second plate and the environment.

16. The method of claim 10, wherein the first plate is coupled to a second environment, the method further comprising:

coupling a second plurality of ductile fibers to the first plate, the second plurality of ductile fibers configured to transfer heat between the first plate and the second environment.

17. The method of claim 10, further comprising:
coupling a third plate to the first plurality of ductile fibers and the second plate, the third plate arranged between the second plate and the first plurality of ductile fibers.

18. The method of claim 10, further comprising coupling a wall comprising insulative material between the first plate and the second plate, the wall situated around at least one of the plurality of thermoelectric elements.

\* \* \* \* \*